United States Patent [19]
Holmdahl

[11] Patent Number: 5,343,164
[45] Date of Patent: Aug. 30, 1994

[54] OPERATIONAL AMPLIFIER CIRCUIT WITH SLEW RATE ENHANCEMENT

[75] Inventor: Todd E. Holmdahl, Bothell, Wash.

[73] Assignee: John Fluke Mfg. Co., Inc., Everett, Wash.

[21] Appl. No.: 36,983

[22] Filed: Mar. 25, 1993

[51] Int. Cl.⁵ .............................................. H03F 3/45
[52] U.S. Cl. ................... 330/253; 330/300; 330/255; 330/257; 330/261
[58] Field of Search .............. 330/253, 257, 261, 255, 330/252, 300

[56] References Cited

U.S. PATENT DOCUMENTS 4,843,341 6/1989 Hosticha et al. .................. 330/261

FOREIGN PATENT DOCUMENTS 0459070 12/1991 European Pat. Off. ............ 330/257

*Primary Examiner*—James B. Mullins
*Assistant Examiner*—Jim Dudek
*Attorney, Agent, or Firm*—Dellett & Walters

[57] ABSTRACT

A low power operational amplifier adjusts its output slew rate by providing additional bias current to its differential amplifier stage when the amplitude of the differential input signal exceeds a given threshold. The additional bias current provides an enhanced current for charging or discharging an internal compensating feedback capacitor of the operational amplifier. The power dissipation of the operational amplifier is kept low by employing FET transistors for the basic operational amplifier functions and by minimally biasing the slew rate enhancement circuitry associated with monitoring the amplitude of the differential input signal as well as providing the additional current to the differential amplifier stage when the amplitude of the differential input signal exceeds the given threshold. The given threshold for the differential input signal is determined according to the bias currents and the width-to-length ratios of the FETs of the differential input stage and the FETs of the monitoring and adjustment circuitry.

13 Claims, 2 Drawing Sheets

OPERATIONAL AMPLIFIER CIRCUIT WITH SLEW RATE ENHANCEMENT

BACKGROUND OF THE INVENTION

The present invention relates to a low power operational amplifier circuit with slew rate enhancement and more particularly to a CMOS operational amplifier circuit with bipolar current enhancement transistors for supplying extra current to the CMOS differential input stage when the operational amplifier is under large signal conditions.

Operational amplifier circuits receive a differential signal at a differential input and produce a single ended output signal as an amplified representation of the input signal. The typical operational amplifier circuit comprises a differential input stage for receiving and amplifying the input signal followed by a single ended amplifier for receiving the amplified signal from the differential amplifier and converting it into a single ended output. Usually, the single ended amplifier includes a compensation network for stabilizing the operational amplifier.

The differential input for the operational amplifier comprises a plus input and a minus input, wherein the differential signal corresponds to the voltage between the plus and minus inputs. With reference to a prior art CMOS design as shown in FIG. 1, the gate of a P-channel transistor 2 corresponds to the minus input while the gate of a P-channel transistor 4 corresponds to the plus input. The two P-channel FETs 2 and 4 are joined at their sources at a current source node 15 which receives a bias current $I_1$ from a current source 16. The drain of transistor 2 is coupled to the drain and gate of an N-channel transistor 9 while the drain of transistor 4 is coupled first, to the drain of an N-channel transistor 10, second, to the gate of an output N-channel transistor 11 and third, to the capacitor C of a compensation network. The gate of transistor 10 is coupled to the gate of transistor 9 and the sources of both transistors 9 and 10 are returned to lower supply voltage $V_{ss}$. Transistors 9 and 10 act as a current mirror for reproducing at the drain of transistor 10 a current corresponding to the current flowing through transistor 9.

When the differential input voltage is zero between the plus and minus inputs, current $I_1$ splits equally between each leg of the differential amplifier. The leg of the differential amplifier corresponding to transistors 4 and 10 receives one-half of the current $I_1$, and the other leg of the differential amplifier corresponding to transistors 2 and 9 receives the other half of the current. With this condition, transistor 10 passes a current identical to that in transistor 9, $I_1/2$, and no current flows to or from compensation capacitor C for discharging or charging the capacitor.

When a voltage is received between the differential inputs of the operational amplifier, the differential input stage amplifies the received input voltage and produces an interstage signal sent to the gate of transistor 11. It may be shown for small signal conditions (wherein the operational amplifier operates in the linear region without any transistors saturating or turning off) that the gain of the differential input amplifier is equal to:

$$A_v = g_{m4}/(g_{o10} g_{o4})$$

where $A_v$ is the small signal gain of the differential amplifier, $g_{m4}$ the transconductance of transistor 4, and $g_{o4}$ and $g_{o10}$ the output admittances of transistors 4 and 10 respectively.

Transistor 11 receives the amplified output signal from the differential input stage and amplifies the signal according to a similar relationship such that the output voltage $V_{out}$ is equal to:

$$V_{out} = V_{gs11}\left(\frac{g_{m11}}{g_{o11} + g_{o17}}\right)$$

where $g_{m11}$ is the transconductance of transistor 11, $g_{o11}$ the output admittance of transistor 11, $g_{o17}$ the output admittance of current source 17 supplying transistor 11 and $V_{gs11}$ the voltage across the gate and source of transistor 11. Note that the effects of "pole" compensation capacitor C and "zero" compensation resistor $R_z$ of the compensation network have been ignored so far.

An ideal operational amplifier provides infinite gain over the entire frequency spectrum. However, real world devices experience frequency limitations and feedback problems such that an operational amplifier without proper compensation runs the risk of oscillating or producing undesirable ringing transients. Therefore, to avoid excessive ringing or oscillation, compensation network C and $R_Z$ is provided in the series feedback path between the drain and gate of output transistor 11. With respect to the frequency domain, capacitor C provides a dominate "pole" for the transfer function of the operational amplifier and resistor $R_z$ optimizes the operational amplifier's frequency response by providing a properly positioned "zero" for the transfer function of the operational amplifier.

It may be shown that the output voltage produced by the operational amplifier in response to an abrupt voltage step at the differential input has a limited rise time. The rise time of the output voltage is limited by the finite bias current $I_1$ available for the differential input stage (at current source node 15) and compensation capacitor C. For FIG. 1, this maximum slew rate $SR_{max}$ for the output voltage is:

$$SR_{max} = \frac{I_1}{C}$$

Improving the slew rate performance of the compensated operational amplifier requires either increasing current $I_1$ or decreasing the value of compensation capacitor C. Increasing current $I_1$ increases the power the operational amplifier dissipates. Decreasing the capacitor value C may reintroduce the ringing troubles and/or oscillation problems. Thus, the standard FET operational amplifier suffers a power/stability/slew rate compromise.

FIG. 2 shows a prior art bipolar operational amplifier circuit with circuitry for improving the slew rate performance of the bipolar operational amplifier. The basic operational amplifier configuration is provided with bipolar transistors 2', 4', 9', 10', 11', current I and compensation capacitor C'. Under small signal conditions, the bipolar operational amplifier circuit receives a differential input signal between the bases of transistors 2' and 4'. The differential amplifier including transistors 2' and 4' amplifies the differential input signal and produces an interstage output signal at the collector of transistor 10' which is sent to output transistor 11' for supplying output voltage $V_{OUT}$ as an amplified representation of the differential input signal.

The basic operational amplifier topology suffers a slew rate limitation according to the original bias current $I=I_o$ and compensation capacitor C. However, the circuit of FIG. 2 includes slew rate enhancement circuitry comprising transistors 1', 3', 5, 6, 7 and 8, resistors 20, 21 and 22, as well as current sources 18' and 19' for enhancing the slew rate performance. If a sudden voltage amplitude step is received at the differential input, i.e., a large signal condition, then the slew rate enhancement circuitry operates to increase current I flowing to the differential pair 2' and 4' so as to enhance the current available for either charging or discharging, depending upon the polarity of the amplitude step, compensation capacitor C.

For example, assume that a positive large signal voltage step is received between the plus and minus inputs. The base of transistor 3' receives an increased voltage which increases, via voltage shifter 6, the voltage at the base of transistor 8, in turn causing transistor 8 to flow a larger current than before for providing an enhanced bias current $I=I+$ with $I+=I_o+\Delta I$ wherein the additional current supplied $\Delta I$ is a function of the large signal amplitude. Without the slew rate enhancement circuitry, only the original bias current $I_o$ would be available for the differential amplifier, but with the slew rate enhancement circuitry, the current I available for the differential amplifier increases according to the magnitude of the large signal received at the differential input. When the large signal voltage is great enough, transistor 4' turns off completely and all of the current supplied to the differential pair flows through transistor 2' and through transistor 9' of the current mirror. The enhanced current $I+$ flowing through transistor 9' provides a given voltage drop between the base and emitter of transistor 9' and consequently between the base and emitter of transistor 10' of the current mirror for enabling a substantially identical enhanced current $I+$ through transistor 10'. With transistor 4' turned off, the enhanced current $I+$ passing through transistor 10' is drawn from capacitor C' and discharges capacitor C' until the required output voltage is produced or until the output transistor of the current source 17' saturates. As capacitor C' integrates the enhanced current $I+$, charge accumulates across the capacitor and the output voltage ramps up with an enhanced slew rate limited by C' and the enhanced current $I+$. Note that without the slew rate enhancement circuitry, the slew rate was limited according to the original small signal bias current $I_o$ supplied to the differential amplifier.

When the voltage polarity of the large signal unit step applied to the differential input is opposite that described above, the circuit operates a little differently. The base of transistor 1' receives an increased voltage potential and the base of transistor 3' a decreased voltage potential. The base of transistor 7 receives via voltage shifter 5 the higher voltage for enabling transistor 7 to pass an enhanced current $I+$ greater than the original small signal bias current $I_o$. On the other side of the differential amplifier, the lower voltage potential is coupled via voltage shifter 6 to the base of transistor 8. If the magnitude of the differential input voltage is large enough, transistor 8 turns off completely and likewise transistor 2'. Under such conditions, the enhanced current $I+$ supplied to the differential amplifier flows through transistor 4' toward the collector node of transistor 10'. With transistor 2' turned off, transistor 9' of the current mirror does not conduct any current and transistor 10' is disabled such that all the current through transistor 4' flows to compensation capacitor C' until the required output voltage is obtained or until transistor 11' saturates. Compensation capacitor C' integrates the enhanced current for ramping the output voltage downward with a slew rate proportional to the enhanced current $I+$ divided by capacitor C'. In this manner, the bipolar operational amplifier of FIG. 2 with slew rate enhancement provides typical small signal amplification when the amplitude of the differential input signal is less than a given large signal threshold, and when the amplitude of the differential input signal is greater than the given large signal threshold, the slew rate enhancement circuitry supplies additional current for enhancing slew rate performance.

However, there is a penalty in that the bipolar operational amplifier with the slew rate enhancement circuitry consumes extra power. Under a condition of zero volts applied to the differential input, slew rate enhancement transistors 7 and 8 establish a bias state for the differential amplifier according to currents $I_{b'}$ of the current sources 18' and 19' and the resistance ratio of resistors 20 and 21 with respect to resistor 22. For FIG. 2, it may be shown for such a condition that the current I will equal twice $I_{b'}$, (assuming the transistors have similar geometries and doping profiles) and that therefore the bipolar differential amplifier stage with the slew rate enhanced circuitry dissipates twice the power of the standard differential amplifier.

What is desired, therefore, is a slew rate enhanced operational amplifier circuit which dissipates low power under small signal conditions without sacrificing stability.

SUMMARY OF THE INVENTION

It is accordingly an object of the present invention to provide a stabilized low power operational amplifier with enhanced slew rate performance.

The present invention provides an operational amplifier with self-adjusting performance capability. A differential amplifier, comprising FET transistors, receives a bias current and a differential input signal and provides an output signal by amplifying the differential input signal. The output signal produced by the FET differential amplifier has a characteristic which is limited according to the bias current. A monitoring and adjustment means adjusts the bias current for enhancing the characteristic of the output signal when a characteristic of the differential input signal exceeds a given threshold.

The subject matter of the present invention is particularly pointed out and distinctly claimed in the concluding portion of the specification. However, both the organization and method of operation, together with further advantages and objects thereof, may best be understood by reference to the following description taken in connection with the accompanying drawings wherein like reference characters refer to like elements.

DETAILED DESCRIPTION

Figure 3:
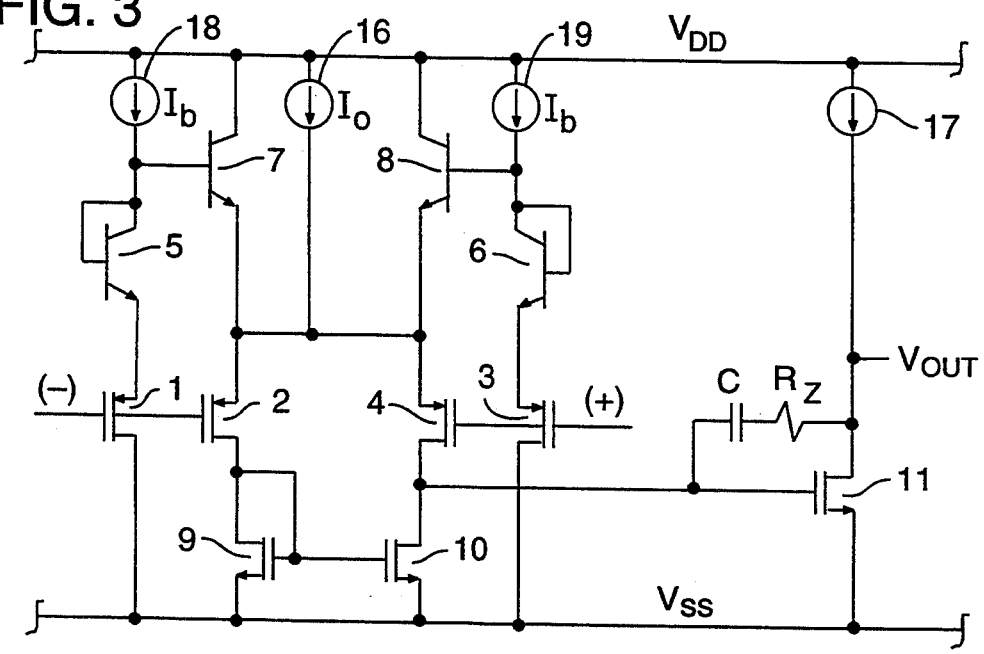
FIG. 3 is a schematic diagram according to the present invention.

FIG. 3 illustrates a MOSFET operational amplifier with slew rate enhancement according to the present invention. A prior art MOSFET operational amplifier topology is encompassed within FIG. 3 and comprises FETs 2, 4, 9, 10 and 11, current sources 16 and 17, and compensation network C and $R_Z$. P-channel MOSFET transistors 2 and 4 receive a differential input signal between the plus input, the gate of transistor 4, and the minus input, the gate of transistor 2. The sources of transistors 2 and 4 are joined together to current source node 15 which is coupled to current source 16 for receiving bias current $I_o$. N-channel MOSFET transistors 9 and 10 operate as a current mirror. The drain and gate of transistor 9 are shorted together and coupled to the drain of transistor 2. The sources of transistors 9 and 10 are returned to lower supply voltage $V_{ss}$. The gate of common source N-channel MOSFET transistor 11 is joined to the drain of transistor 4 for receiving and amplifying an interstage signal, while the source of transistor 11 is coupled to lower supply voltage $V_{ss}$, the drain receiving a bias current from current source 17. Capacitor C and resistor $R_Z$ are connected in series in the feedback path between the drain and gate of transistor 11. The drain of transistor 11 provides the output of the operational amplifier for supplying the output signal $V_{out}$.

The MOSFET operational amplifier with slew rate enhancement differs from the prior art MOSFET topology by virtue of the inclusion of slew rate enhancement circuitry, i.e., MOSFETs 1 and 3, bipolar transistors 5, 6, 7 and 8, and current sources 18 and 19. The gate of P-channel MOSFET 1 is connected to the minus input of the differential amplifier while the gate of P-channel MOSFET 3 is connected to the plus input of the differential amplifier. The drains of MOSFETs 1 and 3 are each returned to the lower supply voltage $V_{ss}$. The sources of P-channel MOSFETs 1 and 3 are connected to the emitters of NPN bipolar transistors 5 and 6 respectively.

The base of bipolar transistor 5, shorted to its collector, is connected to current source 18 for receiving bias current $I_b$. Likewise, the base and collector of bipolar transistor 6 are shorted and connected to current source 19 for receiving bias current $I_b$. The collector of transistor 5 is coupled to the base of current injection transistor 7 while the collector of transistor 6 is similarly coupled to the base of current injection transistor 8. The emitters of current injection transistors 7 and 8 are connected in common to current source node 15 and the collectors of the current injection transistors are coupled to supply voltage $V_{DD}$.

Figure 1:
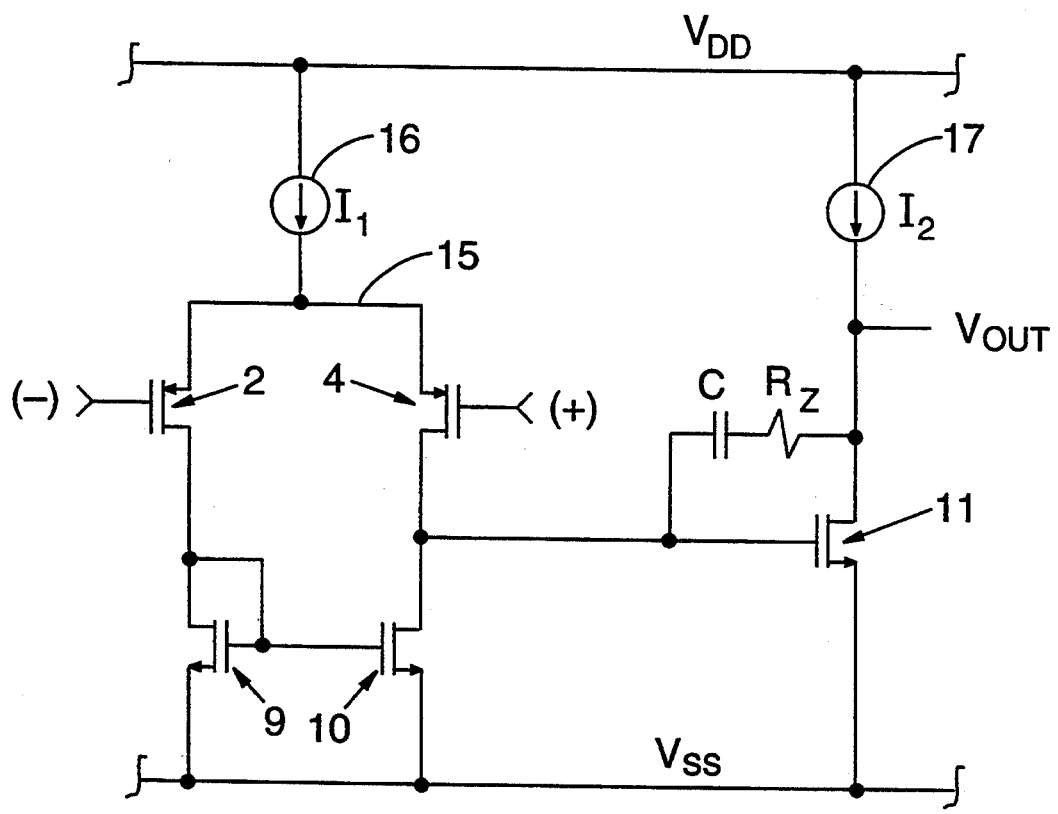
FIG. 1 is a schematic diagram of a prior art CMOS operational amplifier circuit.

A MOSFET transistor provides a drain current according to a voltage established between the gate and source. The gate-to-source voltage $V_{gs}$ required for flowing a given drain current is determined according to the width-to-length ratio of the MOSFET's channel and the corresponding doping density profile. Thus, with reference to the current source mirror of the MOSFET operational amplifier of FIGS. 1 or 3, if the doping profile and width-to-length ratio of transistors 9 and 10 are equal, both of these transistors will provide equal drain currents when receiving equivalent gate-to-source voltages. On the other hand, if the width-to-length ratios are different, then the drain current of one transistor 10 would be related to the drain current of the other transistor 9 according to the respective width-to-length ratios.

In contrast, bipolar transistors effect a given collector current according to the base-to-emitter voltage drop. The base-to-emitter voltage required for providing a given collector current changes according to the dimensions of the base and the associated doping density profile. However, the degree with which the different base dimensions affect the base-to-emitter voltage for a given collector current of a bipolar transistor is to a degree significantly less than the degree with which different channel dimensions of a MOSFET influence different gate-to-source voltage drops for a given drain current. Therefore, for bipolar transistors, it is generally preferred to use emitter-degeneration resistor ratios for bringing about different currents between the bipolar transistors of a current mirror.

Figure 2:
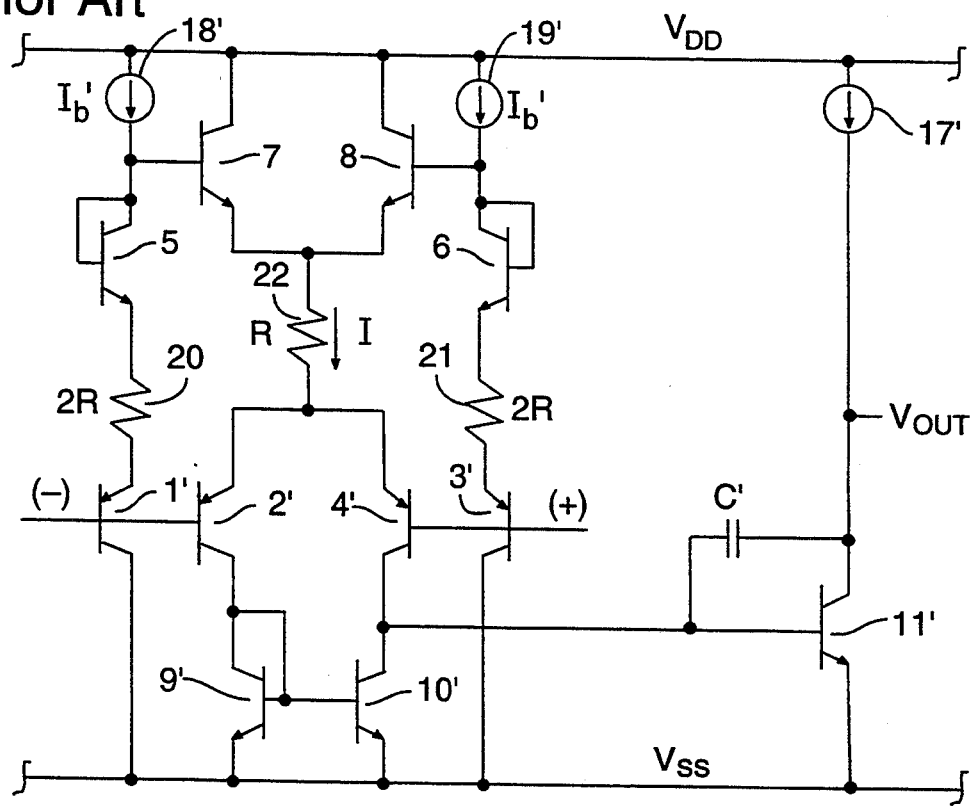
FIG. 2 is a schematic diagram of a prior art bipolar operational amplifier circuit with slew rate enhancement.

The slew rate enhanced bipolar operational amplifier circuit of FIG. 2 ratios emitter-degeneration resistors 20 and 21 with respect to resistor 22, to assure that the small signal bias current I flowing through resistor 22 is twice that of current $I_b'$ of current sources 18' and 19'. In contrast, the CMOS operational amplifier circuit of the present invention with slew rate enhancement establishes proper bias currents by incorporating appropriate width-to-length ratios of the monitoring MOSFET transistors 1 and 3 with respect to the differential amplifier MOSFET transistors 2 and 4 respectively. Absent the emitter-degeneration resistors, the CMOS operational amplifier circuit provides fewer components and improved power efficiency.

In FIG. 2, bipolar transistors 5 and 6 each conduct a current $I_b'$. Ignoring the residual base currents of transistors 7 and 8, $I_b'$ is approximately one-half bias current I flowing through resistor 22. Thus, the monitoring and adjustment slew rate enhancement circuitry (1', 3', 20, 21, 5, 6, 18' and 19') of the bipolar operational amplifier dissipates a power equal to the power dissipated by the primary differential amplifier circuit (9', 10', 2', 4', 22, 7 and 8). However, for the CMOS operational amplifier of FIG. 3 with slew rate enhancement circuitry, the width-to-length ratios (and doping profiles) of the monitoring MOSFETs 3 and 4 and respective differential amplifier MOSFETs 1 and 2 can be selected so that currents $I_b$ of the current sources 18 and 19 can be potentially much less than the corresponding currents $I_b'$ of the bipolar operational amplifier of FIG. 2. In addition, the bias states for the transistors of FIG. 3 can be provided such that the current injection transistors 7 and 8 are just barely on during small signal conditions.

In operation, the slew rate enhanced MOSFET operational amplifier of FIG. 3 receives a differential input signal between the plus and minus inputs. When the differential input voltage is zero volts, the current $I_o$ available for biasing transistors 2 and 4 is received from current source 16 and divided equally between transistors 2 and 4. The current mirror comprising N-channel MOSFET transistors 9 and 10 enables the current received at the drain of transistor 9 to be reproduced at the drain of transistor 10 as long as the gate-to-source voltages, the width-to-length ratios and doping profiles of the two transistors are equivalent to one another.

Under small signal conditions, the currents flowing through transistors 7 and 8 are assumed negligible with respect to current $I_o$ of source 16. Assuming a small signal positive voltage difference is received at the differential input, it may be shown that the voltage $V_{d10}$ produced at the drain of transistor 10 is amplified according to the following equation:

$$\frac{V_{d10}}{V_{in}} = \frac{-g_{m4}}{g_{o4} + g_{o10}}$$

where $V_{in}$ is equal to the voltage applied at the differential input between the plus and minus inputs, $g_m$ the transconductance of transistors 1 and 4, and $g_{o4}$ and $g_{o10}$ the output admittances of transistors 4 and 10 respectively. The interstage signal $V_{d10}$ produced at the drain of transistor 10 is received by the gate of transistor 11, the output amplifier.

The output amplifier provides an output signal which is related to the interstage input signal according to the transfer function of transistor 11 and compensation network C and $R_z$. Compensation capacitor C assures that the transfer function of the operational amplifier circuit has a dominant low frequency pole for stabilizing the operational amplifier. Series resistor $R_z$ of the compensation network provides a zero for the transfer function which optimizes, for a given gain or phase margin, the frequency response of the compensated operational amplifier. Under small signal conditions, the output signal is produced in accordance with the transfer function of the operational amplifier.

The slew rate enhancement circuitry (1, 3, 5, 6, 7, 8, 18 and 19) provides an improved slew rate performance when the amplitude of the differential input signal exceeds a given threshold. Assuming a large signal, positive polarity, differential input voltage is received at the differential input, transistors 3 and 4 turn off and the voltage at the base of bipolar transistor 8 increases for enabling bipolar transistor 8 to flow an additional injection current $I_{q8}$. On the opposite side of the differential amplifier stage, transistors 1 and 2 each receive a greater gate-to-source voltage drop and are enabled to supply additional current. Transistor 7, on the other hand, receives a lower base-to-emitter voltage drop and does not contribute any additional current to current node 15. The additional current $I_{q8}$ produced by current injection transistor 8 combines with bias current $I_o$ and provides an enhanced current I+ for the current summing node 15. Current I+ passes through MOSFET transistor 2. Transistor 9 of the current mirror receives current I+ and produces an enhanced gate-to-source voltage drop for transistor 10, which is therefore enabled to flow a similar enhanced current, I+, for charging capacitor C. Under the large signal conditions, the maximum slew rate is:

$$\frac{dV}{dt} \text{ (Enhanced)} = \frac{I_o + I_{q8}}{C}$$

where $I_{q8}$ is the additional injection current supplied by transistor 8.

When an opposite polarity differential input signal is received, a similar operation results. The minus input receives a large voltage such that transistors 1 and 2 are disabled. The base of transistor 7 receives an increased base voltage which enables transistor 7 to couple an additional injection current $I_{q7}$ into the current summing node 15. At the positive input, the transistors 4 and 3 each receive an increased gate-to-source voltage drop and are enabled to conduct additional currents. The additional injection current $I_{q7}$ of transistor 7 and the original bias current $I_o$ combine as an enhanced current I+ which flows through transistor 4. With differential transistor 2 disabled, transistor 9 is no longer carrying a current and transistor 10 is likewise disabled. Therefore, current I+ flows from transistor 4 toward the output amplifier and is available for charging the capacitor C. As the capacitor C accumulates charge, the output voltage slews negatively with a maximum slew rate of:

$$\frac{dV}{dt} \text{ (Enhanced)} = \frac{I_o + I_{q7}}{C}$$

In this manner, the MOSFET operational amplifier with the slew rate enhancement circuitry provides enhanced slew rates under large signal conditions while maintaining minimal power dissipation under small signal conditions. The need for emitter degeneration resistors has been eliminated given that the slew rate enhancement circuitry of the present invention establishes the input threshold amplitude and bias currents according to the width-to-length ratios of the various MOSFET transistors.

The present invention has been described with reference to MOSFET transistors. In an alternative embodiment of the present invention, the MOSFET transistors are replaced with JFET transistors. The N-channel MOSFET transistors are replaced with N-channel JFET transistors and the P-channel MOSFET transistors are replaced with P-channel JFET transistors.

The output voltage can be buffered through an additional output stage subsequent the output amplifier shown in FIG. 3. The additional output stage is useful for applications wherein the output load, as driven by the operational amplifier, comprises a low impedance or capacitive load.

In an opposite polarity embodiment of the present invention, the transistor and current source devices are replaced with opposite polarity devices in that the N-channel MOSFETs are replaced with P-channel MOSFETs, the P-channel MOSFETs replaced with N-channel MOSFETs, NPN transistors replaced with PNP transistors, and the direction of the current sources reversed accordingly. In addition, the polarity between supply voltages $V_{DD}$ and $V_{ss}$ is reversed.

While preferred embodiments of the present invention have been shown and described, it will be apparent to those skilled in the art that many other changes and modifications may be made without departing from the invention in its broader aspects. The appended claims are therefore intended to cover all such changes and modifications as fall within the true spirit and scope of the invention.

I claim:

1. A differential amplifier with performance enhancement, comprising:

first and second differential FETs having gates providing plus and minus terminals of a differential input and receiving current from a common bias current node, each of said plus and minus terminals being coupled to respective current enhancement means which provide additional current to said common bias current node as the voltage magnitude of a differential voltage at the differential input exceeds a predetermined threshold, wherein each of said current enhancement means includes:

a sensing FET having its gate coupled to the respective terminal of the differential input and providing an output voltage from its source, a voltage shifting means for coupling the output voltage, with a voltage shift, from the source of said sensing transistor to an enhancement control node, and current enhancement transistor means for supplying additional current to said common bias current node in accordance with the voltage shifted output voltage received at said enhancement control node relative the voltage at said common bias current node.

2. A differential amplifier according to claim 1 wherein each of said first and second differential FETs has its source tied to said common bias current node, said current enhancement transistor means comprises a bipolar transistor having its base coupled to said enhancement control node and its emitter coupled to said common bias current node, and said predetermined threshold is established in accordance with a ratio between channel geometries of said differential FETs with respect to said sensing FETs.

3. An operational amplifier with self-adjusting performance enhancement, comprising:

a FET differential amplifier having a differential input for receiving a differential input signal, a bias input for receiving a bias current, and output means for providing an output signal, said FET differential amplifier being operative to produce said output signal by amplifying the received differential input signal, wherein a characteristic of said output signal is limited according to said bias current, and means for monitoring a characteristic of the differential input signal and adjusting said bias current according to said characteristic of the differential input signal when said characteristic of the differential input signal exceeds a predetermined threshold, wherein the FET differential amplifier includes:

first and second input terminals for receiving said differential input signal, a current source node, first and second FET transistors, each having a source, gate and drain, the gates being coupled to the first and second input terminals respectively, the sources being coupled to said current source node, and the drains each having an output impedance, each FET transistor being operative to modulate a drain current according to its transconductance and the voltage between the gate and source, first bias means coupled to said current source node for supplying a first bias current to the current source node for biasing the first and second FET transistors, and a current mirror having first and second ports connected to the drain of said first FET transistor and the drain of said second FET transistor respectively for receiving the modulated drain currents and current biasing the first and second FET transistors substantially under small signal conditions and generating an interstage signal according to received modulated drain currents, wherein the output means of said FET differential amplifier comprises amplifier means having an input connected to a primary one of said first and second ports for receiving said interstage signal, an output, and compensation means coupled between the output and the input of the amplifier means for compensating said FET differential amplifier, said compensation means limiting the transition speed of said output signal according to the compensation thereof and current supplied to said current source node, said monitoring and adjustment means comprising means for enhancing the transition speed of said output signal by providing more current to said current source node when the amplitude of said differential input signal exceeds a given threshold.

4. An operational amplifier according to claim 3 wherein the first and second FET transistors each have a given width/length ratio, and said monitoring and adjustment means comprises:

third and fourth FET transistors, each of said third and fourth FET transistors having a given width/length ratio, the gates of said third and fourth FET transistors being coupled to the first and second input terminals respectively of said FET differential amplifier, the drains of said third and fourth transistors being connected to a first voltage node and the sources of said third and fourth FET transistors providing first and second buffered outputs for supplying first and second buffered signals representative of the signals received at the first and second input terminals respectively, and first and second current injection means, receiving the respective ones of said first and second buffered signals and being operative to supply additional current to said current source node when the buffered signals exceed a given threshold determined according to said width/length ratios.

5. An operational amplifier according to claim 4 wherein the first and second current injection means each comprises:

a base-collector shorted bipolar transistor having its emitter connected to the source of the respective one of said third and fourth FET transistors for receiving the respective buffered signal and operative to shift the voltage of the respective buffered signal received, and a current injection bipolar transistor having its collector coupled to a second voltage node, its base coupled to the base and collector of a respective base-collector shorted bipolar transistor for receiving the shifted signal therefrom, and its emitter coupled to said current source node for injecting said additional current into the current source node.

6. An operational amplifier according to claim 3 wherein the compensation means comprises a capacitor in the series feedback path between the input and output of the output amplifier means, and wherein said output transition speed is limited according to the capacitance of said capacitor and the total current supplied to said current source node.

7. A self-adjusting amplifier comprising:

a differential common source amplifier, comprising a pair of common source connected FETs, with the gates of said pair of common source connected FETs providing a differential input for receiving a differential input signal therebetween, current source means, the sources of said FETs being coupled to said current source means for receiving a bias current, and the drains providing a differential output for producing a differential output signal, wherein a characteristic of said differential output signal is affected according to said bias current and a characteristic of the differential input signal, and means for monitoring said characteristic of the differential input signal and adjusting said bias current when said characteristic of the differential input signal exceeds a given threshold, said monitoring means comprising:

first and second sensing FETs having gates coupled to respective gates of said common source connected FETs of the differential common source amplifier and each of said sensing FETS having a source providing an output signal directly related to the voltage at its gate, and first and second current injection means for providing enhanced current to the common source node of said common source connected FETs, said first and second current injection means being controlled by respective output signals provided from the sources of said first and second sensing FETs.

8. A self-adjusting amplifier according to claim 7 wherein said characteristic of the differential output signal is maximum output current and said characteristic of the input signal is amplitude.

9. A self-adjusting amplifier according to claim 7 further comprising:

output amplifier means having an input terminal receiving said differential output signal and an output terminal for supplying an output signal, and compensation means coupled between the input terminal and the output terminal of the output amplifier means for stabilizing said self-adjusting amplifier with a given frequency response, wherein the output amplifier means produces said output signal by processing said differential output signal according to said frequency response, and said bias current effects a maximum slew rate for said output signal in accordance with the compensation means and said bias current, and wherein the means for monitoring and adjusting establishes said maximum slew rate by adjusting said bias current, with said enhanced current, in accordance with the amplitude of the differential input signal.

10. A self-adjusting amplifier according to claim 9 wherein the output amplifier means comprises:

intermediate means connected to the differential common source amplifier for receiving said differential output signal and operative to convert said differential output signal into an interstage signal by applying said differential output signal to an impedance thereof, and a common source FET transistor with the gate thereof connected to said intermediate means for receiving the interstage signal and having a drain supplying an output signal, the compensation means comprising a capacitor in series feedback between the drain and the gate of said common source FET transistor, said maximum slew rate being determined according to the bias current and the capacitance of said capacitor.

11. A self-adjusting amplifier according to claim 7 wherein each of said first and second current injection means includes a bipolar transistor having its emitter coupled to said common source node for providing additional current thereto as controlled by a base voltage received at its base and level shifter means for coupling the respective output signal from the associated source of said first and second sensing FETs to said base with a voltage shift.

12. A self-adjusting amplifier according to claim 11 wherein said given threshold is determined according to a ratio between channel geometries of said common source connected FETs with respect to said sensing FETs.

13. An operational amplifier with self-adjusting performance enhancement, comprising:

a FET differential amplifier having a differential input for receiving a differential input signal, a bias input for receiving a bias current, and output means for providing an output signal, said FET differential amplifier being operative to produce said output signal by amplifying the received differential input signal, wherein a characteristic of said output signal is limited according to said bias current, and means for monitoring a characteristic of the differential input signal and adjusting said bias current according to said characteristic of the differential input signal when said characteristic of the differential input signal exceeds a predetermined threshold, wherein the FET differential amplifier comprises first FET transistors provided with channels having first predetermined width-to-length ratios to effect respective drain currents for given gate-to-source voltage drops, said monitoring and adjustment means comprising second FET transistors coupled to said differential input and provided with channels having second predetermined width-to-length ratios to effect respective drain currents for given gate-to-source voltage drops, and said monitoring and adjustment means including means for providing additional current to said first FET transistors when the amplitude of the signal as presented to said second FET transistors exceeds a predetermined threshold determined according to the ratio between said first predetermined width-to-length ratios and said second predetermined width-to-length ratios.

* * * * *